(12) United States Patent
Anton et al.

(10) Patent No.: US 11,006,522 B2
(45) Date of Patent: May 11, 2021

(54) TEXTILE MATERIAL COMPRISING CONDUCTIVE ELEMENTS

(71) Applicant: Bayerische Motoren Werke Aktiengesellschaft, Munich (DE)

(72) Inventors: Moritz Anton, Munich (DE); Sophie Richter, Munich (DE); Martin Schmid, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 16/764,939

(22) PCT Filed: Nov. 21, 2018

(86) PCT No.: PCT/EP2018/081996
§ 371 (c)(1),
(2) Date: May 18, 2020

(87) PCT Pub. No.: WO2019/101762
PCT Pub. Date: May 31, 2019

(65) Prior Publication Data
US 2020/0296830 A1    Sep. 17, 2020

(30) Foreign Application Priority Data

Nov. 22, 2017  (DE) ...................... 10 2017 220 827.9

(51) Int. Cl.
*H05K 1/03* (2006.01)
*H05K 1/18* (2006.01)
*B60R 16/02* (2006.01)
*H05K 1/09* (2006.01)
*H03K 17/96* (2006.01)

(52) U.S. Cl.
CPC ............. *H05K 1/038* (2013.01); *B60R 16/02* (2013.01); *H05K 1/09* (2013.01); *H05K 1/181* (2013.01);
(Continued)

(58) Field of Classification Search
CPC ....... H05K 17/962; H05K 2217/96078; H05K 1/038; H05K 1/11; H05K 1/09; H05K 1/118; H05K 1/181
See application file for complete search history.

(56) References Cited

U.S. PATENT DOCUMENTS 9,092,096 B2     7/2015  Li et al.
2007/0186667 A1  8/2007  Deangelis et al.
(Continued)

FOREIGN PATENT DOCUMENTS

DE          102 20 642 A1    7/2003
DE   10 2006 017 732 A1    10/2007
(Continued)

OTHER PUBLICATIONS

International Search Report (PCT/ISA/210) issued in PCT Application No. PCT/EP2018/081996 dated Feb. 13, 2019 with English translation (six (6) pages).
(Continued)

*Primary Examiner* — Hoa C Nguyen
(74) *Attorney, Agent, or Firm* — Crowell & Moring LLP

(57) ABSTRACT

Textile material having conductive elements for an interior of a vehicle includes a flat textile substrate having a first surface and an opposite second surface. At least one conductor track formed of a conductive paint is printed onto the first surface. At least one sensitive element, which is electrically conductively connected to the conductor track on the first surface, is arranged on the second surface.

7 Claims, 3 Drawing Sheets

(52) U.S. Cl.
CPC . *H03K 17/962* (2013.01); *H03K 2217/96078* (2013.01); *H05K 2201/10053* (2013.01)

(56) References Cited

U.S. PATENT DOCUMENTS

| | | | |
|---|---|---|---|
| 2014/0318699 A1* | 10/2014 | Longinotti-Buitoni | A61B 5/6805 |
| | | | 156/247 |
| 2014/0339211 A1 | 11/2014 | Barfuss et al. | |
| 2014/0343392 A1 | 11/2014 | Yang | |
| 2015/0091859 A1* | 4/2015 | Rosenberg | G06F 3/044 |
| | | | 345/174 |
| 2016/0320037 A1 | 11/2016 | Wong et al. | |
| 2017/0327016 A1 | 11/2017 | Worlitz | |

FOREIGN PATENT DOCUMENTS

| | | |
|---|---|---|
| DE | 11 2014 002 044 T5 | 1/2016 |
| DE | 10 2016 102 667 A1 | 8/2017 |
| DE | 10 2016 108 632 B3 | 8/2017 |
| EP | 1 927 825 A1 | 6/2008 |

OTHER PUBLICATIONS

German-language Written Opinion (PCT/ISA/237) issued in PCT Application No. PCT/EP2018/081996 dated Feb. 13, 2019 (five (5) pages).

German-language Search Report issued in German Application No. 10 2017 220 827.9 dated Jun. 14, 2018 with partial English translation (17 pages).

Holleis et al., "Evaluating Capacitive Touch Input on Clothes," ACM 10$^{th}$ International Conference Interaction with Mobile Devices and Services, MobileHCI, Sep. 2-5, 2008, pp. 81-90 (10 pages).

Post et al, "E-broidery: Design and fabrication of textile-based computing," IBM Systems Journal, 2000, pp. 840-860, vol. 39, Nos. 3-4 (21 pages).

Stoppa et al., "Wearable Electronics and Smart Textiles: A Critical Review," Sensors, 2014, pp. 11957-11992, vol. 14 (36 pages).

\* cited by examiner

TEXTILE MATERIAL COMPRISING CONDUCTIVE ELEMENTS

FIELD OF THE INVENTION

The invention relates to a textile material with conductive elements for a passenger compartment of a vehicle.

BACKGROUND OF THE INVENTION

So-called "smart textiles", in which electronics and textiles merge with one another, are known in the prior art. By virtue of the integration of conductive and extensible electrical connections into a textile, conductor tracks or entire switching circuits can be printed onto the fabric. In this case, the textile serves as circuit board. As a rule, for this purpose a paint with conductive silver particles or carbon nanoparticles is applied onto the fabric. A disadvantageous aspect of this is that all of the imprinted conductor tracks react sensitively, so that an undesired action is triggered in the event of inadvertent touching.

SUMMARY OF THE INVENTION

In accordance with the invention, a textile material with conductive elements is therefore provided for a passenger compartment of a vehicle, comprising a textile substrate formed in two dimensions with a first surface and with an opposing second surface; wherein at least one conductor track has been imprinted onto the first surface with at least one conductive paint, and wherein at least one sensitive element has been arranged on the second surface, the sensitive element having been connected in electrically conducting manner to the conductor track on the first surface. As a result, it is possible that sensitive elements are exposed only at selective places, namely on the second surface. By this means, an inadvertent actuation at undesirable places along the conductor tracks can be avoided. Moreover, switching elements can be directly integrated into the fabric in this way, and weight can be saved. In this regard, the textile material is arranged in the passenger compartment of the vehicle in such a way that the second surface with the sensitive element points into the passenger compartment of the vehicle.

In one embodiment, both the conductor track and the sensitive element have been imprinted on the first surface with at least one conductive paint so as to be connected to one another in a conducting manner, the textile substrate having been cut around a partial periphery of the sensitive element, and a folding region, resulting therefrom, with the sensitive element having been folded along a folding edge of the textile substrate in such a way that the second surface of the folding region points toward the unfolded second surface and, as a result, the sensitive element has been arranged on the second surface. As a result, the sensitive element and the conductor tracks can be applied onto the first surface in a common printing process. In this way, the sensitive element can be arranged on the second surface in a straightforward manner.

The folding region is preferably V-shaped. As a result, an arrow symbolism that facilitates operational control can be provided in a straightforward manner.

In another embodiment, a conductive thread on the second surface has been sewn through the textile substrate and on a region of the conductor track on the first surface, as a result of which the sensitive element has been formed. As a result, the conductor track only has to be printed onto the first surface, and the sensitive element can be sewn onto the textile substrate in a straightforward manner.

In a preferred embodiment, the sensitive element takes the form of a capacitive switch. In this case, the sensitive element with its associated conductor tracks may preferably have been further surrounded by one or more other conductor tracks.

In all embodiments, the sensitive element has preferably been formed in two dimensions, as a result of which the operational control is facilitated.

In another preferred embodiment, a vehicle includes a textile material according to the invention. In this case, the textile material has preferably been arranged in the passenger compartment in such a way that the first surface is mounted on a component of the passenger compartment, and the second surface and the sensitive element point into the passenger compartment of the vehicle.

BRIEF DESCRIPTION OF THE DRAWINGS

Embodiments of the invention will be described below with reference to the figures. Shown are.

DETAILED DESCRIPTION OF THE DRAWINGS

Figure 1A:
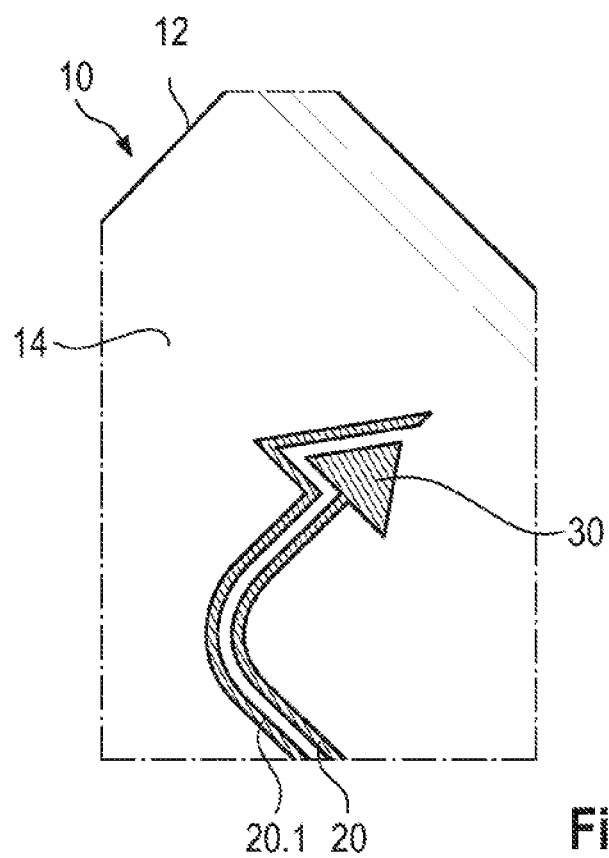
FIG. 1A: a first schematic exemplary embodiment of the textile material with conductive elements in a top view of the first surface.
Figure 1B:
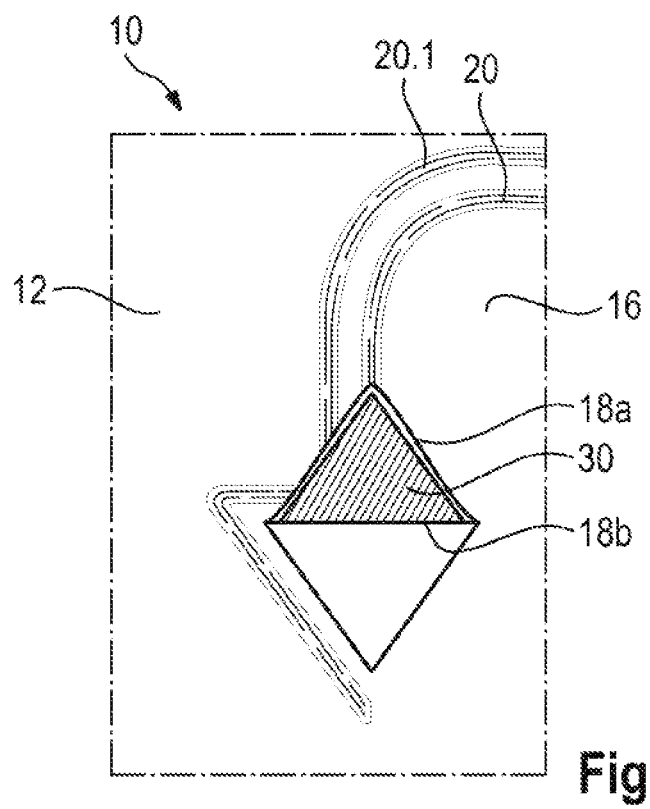
FIG. 1B: the exemplary embodiment from FIG. 1A in a top view of the second surface, the textile substrate here having been cut.

FIGS. 1A and 1B show an exemplary embodiment of a textile material 10 with conductive elements.

The textile material 10 comprises a textile substrate 12 formed in two dimensions with a first surface 14 and with a second surface 16. The first surface 14 is shown in FIG. 1A, whereas the second surface 16 is shown in FIG. 1B.

As shown in FIG. 1A, in this exemplary embodiment a conductor track 20 and a sensitive element 30 have been printed onto the first surface 14 with a conductive paint. The conductor track 20 and the sensitive element 30 have been imprinted so as to be connected to one another in conducting manner. The sensitive element 30 has preferably been imprinted two-dimensionally, particularly preferably in a triangular shape or in the shape of a V. In addition to the conductor track 20 and the sensitive element 30, at least one further conductor track 20.1 may have been imprinted onto the first surface 14. As a result, a capacitive switch can be provided.

As shown in FIG. 1B, the textile substrate 12 has been cut around a partial periphery of the sensitive element 30. For instance, the textile substrate 12 may have been cut around the two triangle sides of the sensitive element 30 that are located opposite the conductor track 20.

In order that the sensitive element 30 has finally been arranged on the second surface 16, a folding region 18a, resulting from the cut, with the sensitive element 30 has been folded along a folding edge 18b of the textile substrate in such a way that the second surface 16 of the folding region 18a points toward the unfolded second surface 16. Hence a through-contacting onto the second surface 16 is obtained.

Figure 2:
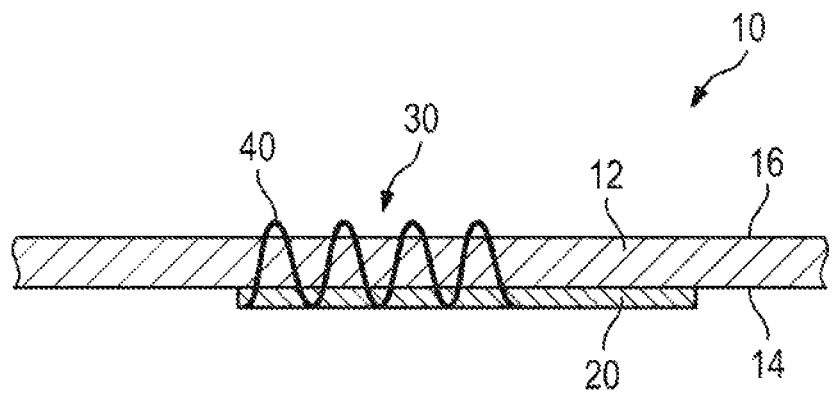
FIG. 2: a second schematic exemplary embodiment of the textile material with conductive elements in a sectional view.

FIG. 2 shows another exemplary embodiment of the textile material 10 with conductive elements. In this sectional view, the textile substrate 12 with the first surface 14 and with the second surface 16 is likewise shown. Similar to FIG. 1A, the conductor track 20 has been printed onto the first surface 14 with a conductive paint. At least one further conductor track 20.1 may also have been imprinted (not shown) onto the first surface 14. Consequently a capacitive switch can again be provided.

In FIG. 2 it is evident that a conductive thread 40 on the second surface 16 has been sewn through the textile substrate 12 and on a region of the conductor track 20 on the first surface 14. By virtue of the fact that the conductive thread 40 has been sewn on the region of the conductor track 20, the conductive thread 40 has been connected to the conductor track 20 in electrically conducting manner. On the second surface 16 the conductive thread 40 consequently forms the sensitive element 30, and the textile substrate 12 has consequently been selectively perforated in the region of the sensitive element 30. Hence a through-contacting onto the second surface 16 is obtained. The conductive thread 40 has preferentially been stitched two-dimensionally on the second surface 16.

Figure 3A:
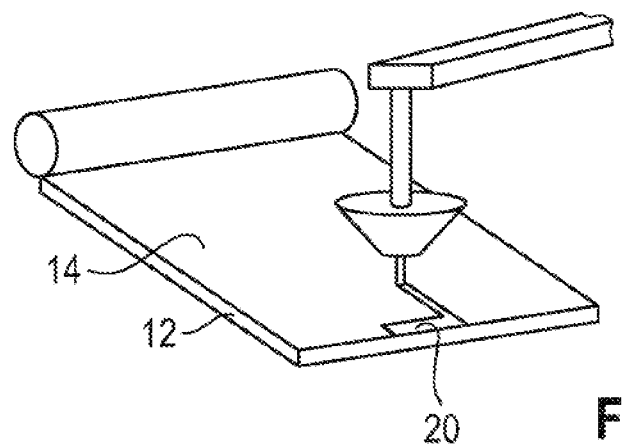
FIGS. 3A to 3D: a printing of the textile substrate and an arrangement of the textile material on an armrest in the passenger compartment of the vehicle.
Figure 3B:
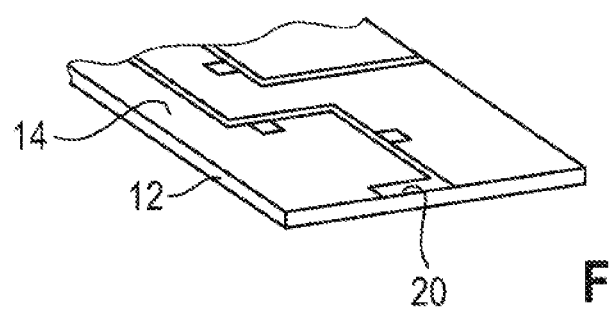

FIGS. 3A and 3B show a printing of the textile substrate 12 on its first surface 14 according to FIGS. 1A, 1B and 2. For the purpose of simplification, only conductor tracks 20 are shown in FIGS. 3A and 3B.

Figure 3C:
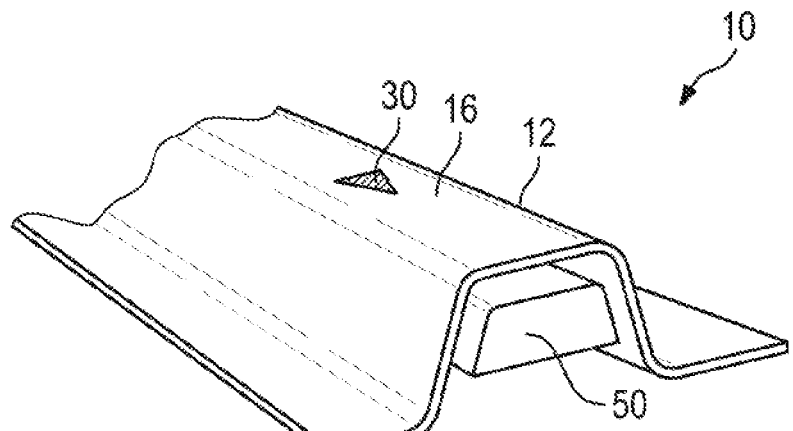
Figure 3D:
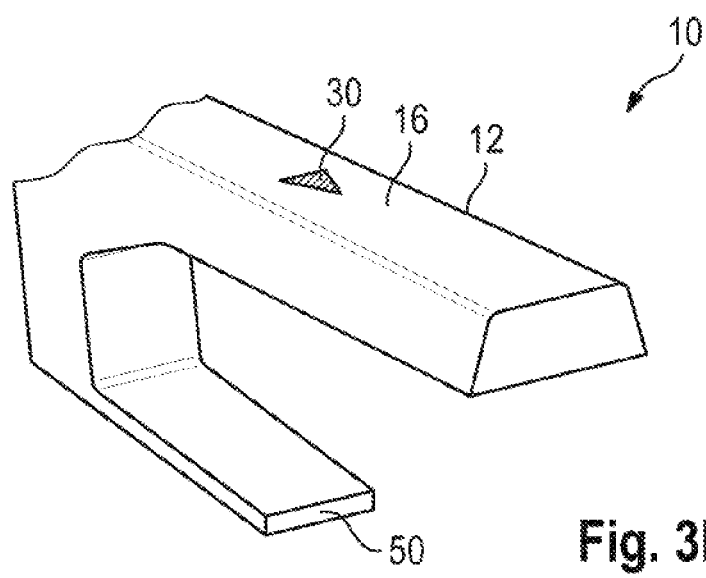

FIGS. 3C and 3D show an exemplary arrangement of the textile material on an armrest 50 in the passenger compartment of the vehicle. The first surface 14 is being mounted on the armrest 50. The second surface 16 and the sensitive element 30 consequently point into the passenger compartment of the vehicle. The conductor track(s) 20 has/have thereby been protected against unintentional touching.

In all embodiments, the textile material 10 with the textile substrate 12, with the conductor track 20 and with the sensitive element 30 (imprinted as in FIGS. 1A and 1B, or sewn on as in FIG. 2) may have been designed to be stretchable.

LIST OF REFERENCE SYMBOLS 10 textile material
12 textile substrate
14 first surface
16 second surface
18a folding region
18b folding edge
20 conductor track
30 sensitive element
40 conductive thread
50 component in passenger compartment of the vehicle

What is claimed is:

1. A textile material with conductive elements for a passenger compartment of a vehicle, comprising
a textile substrate formed in two dimensions with a first surface and with an opposing second surface;
at least one conductor track imprinted onto the first surface with at least one conductive paint; and
at least one sensitive element arranged on the second surface, wherein
the at least one sensitive element is connected in an electrically conducting manner to the conductor track on the first surface,
both the conductor track and the sensitive element are imprinted on the first surface with at least one conductive paint so as to be connected to one another in the electrically conducting manner,
the textile substrate is cut around a partial periphery of the sensitive element, and
a folding region resulting therefrom with the sensitive element is folded along a folding edge of the textile substrate such that the second surface of the folding region points toward the unfolded second surface, whereby the sensitive element has been arranged on the second surface.

2. The textile material according to claim 1, wherein the folding region is V-shaped.

3. The textile material according to claim 1, wherein a conductive thread on the second surface is sewn through the textile substrate and on a region of the conductor track on the first surface and thereby forms the sensitive element.

4. The textile material according to claim 1, wherein the sensitive element takes the form of a capacitive switch.

5. The textile material according to claim 1, wherein the sensitive element is formed in two dimensions.

6. A vehicle comprising a textile material according to claim 1.

7. The vehicle according to claim 6, wherein the textile material is arranged in a passenger compartment such that the first surface is mounted on a component of the passenger compartment, and the second surface and the sensitive element face into the passenger compartment of the vehicle.

* * * * *